(12) United States Patent
Nagasaki et al.

(10) Patent No.: US 7,719,040 B2
(45) Date of Patent: May 18, 2010

(54) SOLID-STATE IMAGING DEVICE

(75) Inventors: Hiroki Nagasaki, Kyoto (JP); Shouzi Tanaka, Nara (JP)

(73) Assignee: Panasonic Corporation, Osaka (JP)

( * ) Notice: Subject to any disclaimer, the term of this patent is extended or adjusted under 35 U.S.C. 154(b) by 134 days.

(21) Appl. No.: 11/997,673

(22) PCT Filed: Jul. 27, 2006

(86) PCT No.: PCT/JP2006/314884

§ 371 (c)(1),
(2), (4) Date: Feb. 1, 2008

(87) PCT Pub. No.: WO2007/015420

PCT Pub. Date: Feb. 8, 2007

(65) Prior Publication Data

US 2009/0045407 A1 Feb. 19, 2009

(30) Foreign Application Priority Data

Aug. 3, 2005 (JP) .............................. 2005-225510

(51) Int. Cl.
*H01L 31/112* (2006.01)
(52) U.S. Cl. ................. 257/292; 257/294; 257/E27.133
(58) Field of Classification Search ................. 257/233, 257/292, 294, 229, 231, E31.054, E27.133, 257/E27.13, E27.132
See application file for complete search history.

(56) References Cited

U.S. PATENT DOCUMENTS

| | | | |
|---|---|---|---|
| 6,023,081 A * | 2/2000 | Drowley et al. ............. | 257/292 |
| 6,040,593 A | 3/2000 | Park | |
| 6,734,906 B1 * | 5/2004 | Hashimoto ................. | 348/302 |
| 6,977,684 B1 | 12/2005 | Hashimoto et al. | |
| 7,091,536 B2 * | 8/2006 | Rhodes et al. .............. | 257/291 |
| 2003/0173585 A1 | 9/2003 | Kimura et al. | |
| 2004/0000681 A1 | 1/2004 | Shinohara et al. | |
| 2004/0245433 A1 | 12/2004 | Koyama | |
| 2005/0045928 A1 * | 3/2005 | Kuriyama ................... | 257/294 |

FOREIGN PATENT DOCUMENTS

JP        05-110960        4/1993

(Continued)

*Primary Examiner*—Victor A Mandala
*Assistant Examiner*—Scott Stowe
(74) *Attorney, Agent, or Firm*—McDermott Will & Emery LLP (57) ABSTRACT

Realized is a solid-state imaging device capable of achieving both a finer pixel size and high light receiving efficiency with an excellent image characteristic. A high concentration p-well layer (5) is partially formed in the interior of a semiconductor substrate (1) centering on a region under a STI (6), and a photoelectric conversion layer (9a, 9b) is formed so as to extend to a region under a gate electrode (10a, 10b). Furthermore, a salicide region (12a, 12b) covers only a portion of a surface of the gate electrode (10a, 10b) and is formed at a position closer to a side at which a drain region (13) is provided. Thus, an incident light is allowed to pass through a portion, included in the surface of the gate electrode (10a, 10b), on which the salicide region (12a, 12b) is not formed, and then to be further incident on the photoelectric conversion layer (9a, 9b) extending to the region under the gate electrode (10a, 10b).

11 Claims, 8 Drawing Sheets

FOREIGN PATENT DOCUMENTS

| | | |
|---|---|---|
| JP | 08-316448 | 11/1996 |
| JP | 11-331713 | 11/1999 |
| JP | 2000-031449 | 1/2000 |
| JP | 2000-078474 | 3/2000 |
| JP | 2000-78475 | 3/2000 |
| JP | 2000-059696 | 5/2000 |
| JP | 2003-264283 | 9/2003 |
| JP | 2004-193547 | 7/2004 |
| JP | 2004-349430 | 12/2004 |
| JP | 2004-356246 | 12/2004 |
| JP | 2005-129965 | 5/2005 |

\* cited by examiner

SOLID-STATE IMAGING DEVICE

Related Applications

This application is the U.S. National Phase under 35 U.S.C. §371 of International Application No. PCT/JP2006/314884, filed on Jul. 27, 2006, which in turn claims the benefit of Japanese Application No. 2005-225510, filed on Aug. 3, 2005, the disclosures of which Applications are incorporated by reference herein.

TECHNICAL FIELD

The present invention relates to a solid-state imaging device, and more particularly to a solid-state imaging device in which a plurality of pixels are arranged in a matrix.

BACKGROUND ART

In order to improve an image characteristic, a higher light receiving efficiency is required for a solid-state imaging device typified by a CCD type or MOS type image sensor. Generally, it is known that a converging lens is used to increase a light receiving efficiency.

Also, in recent years, along with the miniaturization of the solid-state imaging device, it is desirable that a pixel size be finer. In order to satisfy such a demand, the pixel size is attempted to be finer by causing a plurality of pixels adjacent to one another to share one gate electrode or one drain region. Hereinafter, a solid-state imaging device having cells each composed of two pixels (as a unit), for example, will be described in detail.

Figure 9:
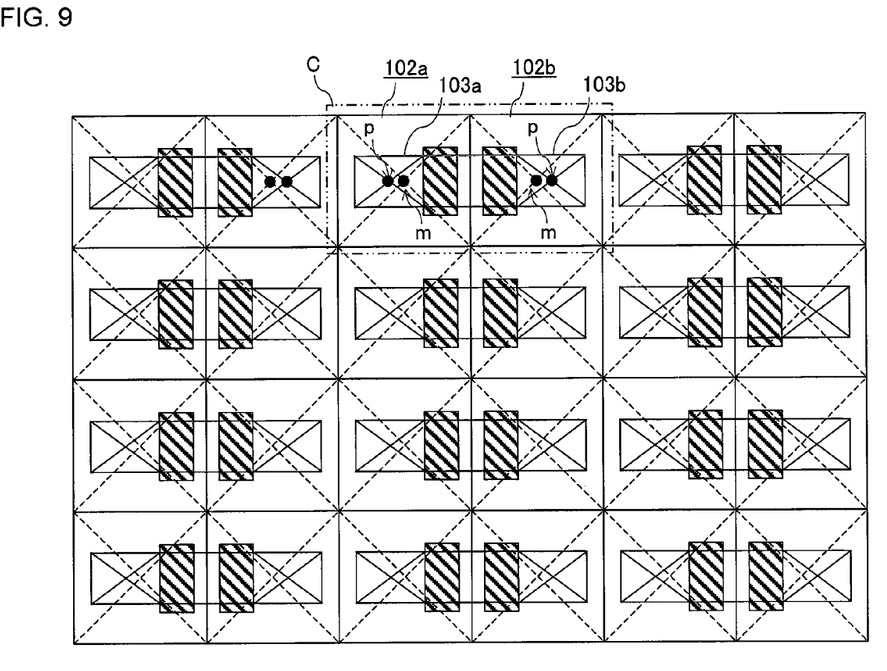
FIG. 9 is a plan view schematically illustrating the conventional solid-state imaging device.

FIG. 9 is a plan view schematically illustrating a conventional solid-state imaging device. Note that FIG. 9 shows a state where a partial structure of the solid-state imaging device is projected onto a main surface of a semiconductor substrate.

The solid-state imaging device shown in FIG. 9 includes a plurality of pixels arranged in a matrix on the semiconductor substrate. Generally, a silicon substrate of n-type is used as the semiconductor substrate. Two pixels 102a and 102b adjacent to each other constitute one cell C. Each of the pixels 102a and 102b includes a photoelectric conversion section (not shown) for converting an incident light into a signal electric charge. Furthermore, light receiving regions 103a and 103b, each region for allowing a light to be incident on the photoelectric conversion section, are formed in predetermined regions in the interior of the pixels 102a and 102b, respectively. Each of the light receiving regions 103a and 103b, having the same shape as one another, is formed at a predetermined position with respect to a center m of each of the pixels 102a and 102b.

Next, with reference to FIGS. 10 and 11, a positional relationship between the pixel 2 and the light receiving region 3 will be described in more detail.

Figure 10:
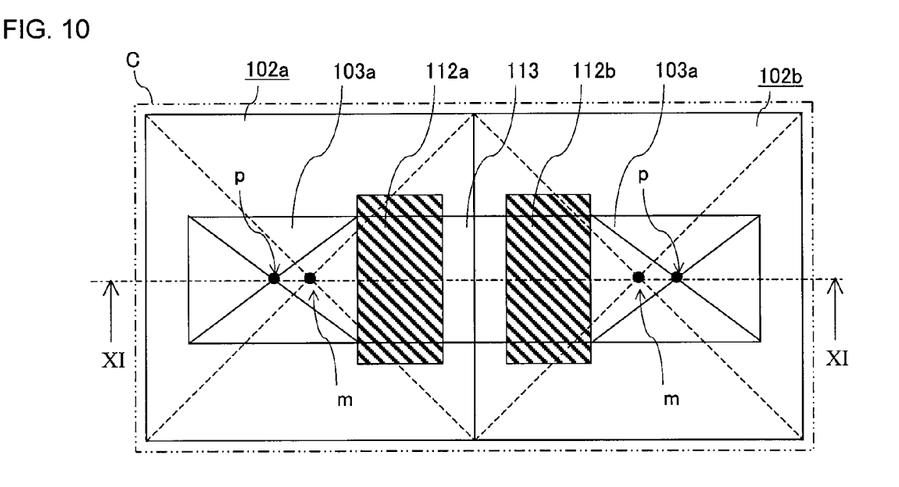
FIG. 10 is an enlarged view of a portion of FIG. 9 indicated by double-dot-dash lines.

FIG. 10 is an enlarged view of a portion of FIG. 9 indicated by double-dot-dash lines. FIG. 11 is a cross-sectional view of the portion along lines XI-XI shown in FIG. 10.

Figure 11:
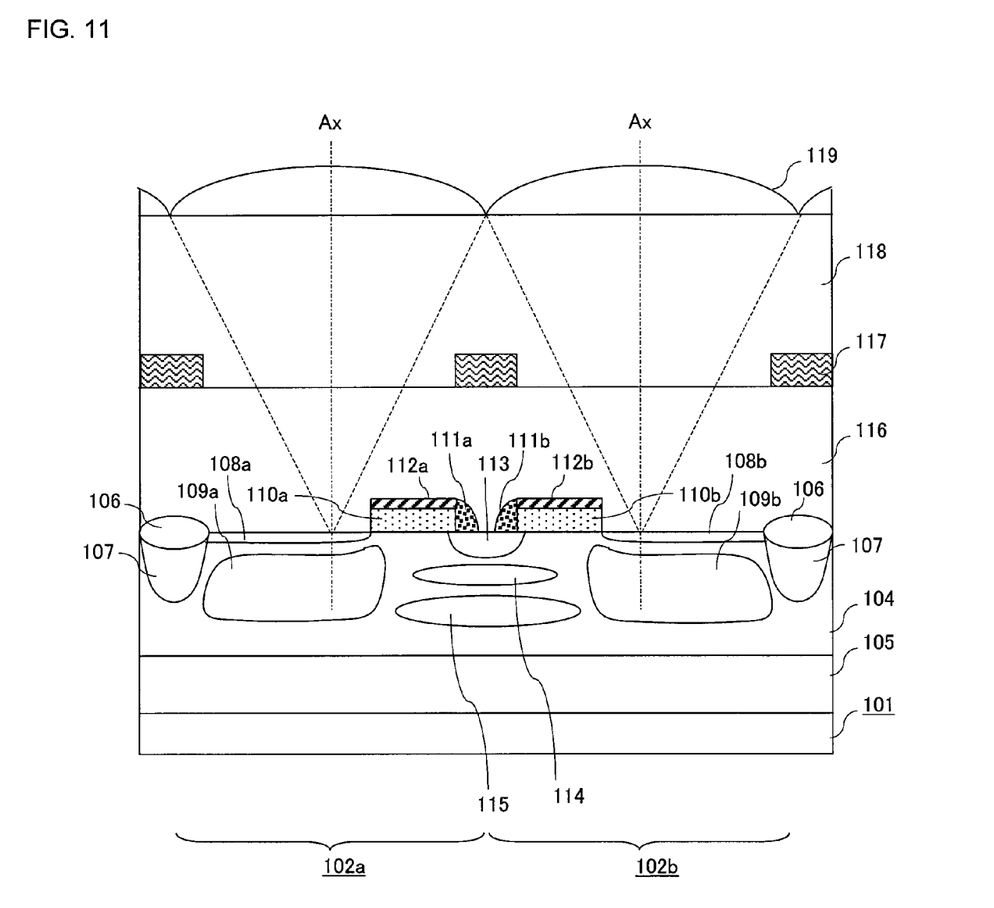
FIG. 11 is a cross-sectional view of the portion along lines XI-XI shown in FIG. 10.

As shown in FIGS. 10 and 11, the conventional solid-state imaging device includes a semiconductor substrate 101, a low concentration p-well layer 104, a high concentration p-well layer 105, a device isolation region 106, a p-type implantation isolation layer 107, p-type photoelectric conversion sections 108a and 108b, n-type photoelectric conversion sections 109a and 109b, gate electrodes 110a and 110b, spacers 111a and 111b, salicide regions 112a and 112b, a drain region 113, a Vt control layer 114, a barrier control layer 115, an insulation film 116, a light shielding film 117, a color filter 118, and converging lenses 119.

The pixel 102a mainly includes the photoelectric conversion sections 108a and 109a forming a photodiode, the gate electrode 110a, the salicide region 112a formed on a surface of the gate electrode 110a, and the device isolation region 106. Similarly, the pixel 102b mainly includes the photoelectric conversion sections 108b and 109b, the gate electrode 110b, the salicide region 112b formed on a surface of the gate electrode 110b, and the device isolation region 106.

The insulation film 116 is formed so as to cover a surface of the semiconductor substrate 101 on which the gate electrodes 110a and 110b are formed. The light shielding film 117, having an opening in a predetermined region above each of the photoelectric conversion sections 109a and 109b, is formed on the insulation film 116. By the opening provided with the light shielding film 117, the light receiving regions 103a and 103a for receiving the incident light so as to be incident on the photoelectric conversion sections 109a and 109b, respectively, are formed.

Furthermore, above the light shielding film 117, the color filter 118 and the plurality of converging lenses 119 provided so as to respectively correspond to the pixels 102a and 102b are formed. In order to converge a light to the pixels 102a and 102b as much as possible, each converging lens 119 is arranged so as to cover the largest possible area occupied by each of the pixels 102a and 102b with respect to the semiconductor substrate 101. Specifically, the converging lens 119 is arranged such that its optical axis Ax passes through the center m of each of the pixels 102a and 102b.

In the conventional solid-state imaging device, the two pixels 102a and 102b share the drain region 113 so as to constitute one cell, thereby realizing a finer size of a pixel.

[Patent document 1] Japanese Laid-Open Patent Publication No. 8-316448

DISCLOSURE OF THE INVENTION

Problems to be Solved by the Invention

However, in the conventional solid-state imaging device in which each cell is composed of a plurality of pixels, there is a problem that a light receiving efficiency of the entirety of the solid-state imaging device is reduced, thereby causing deterioration or variation of an image sensitivity, a color shading defect, a sensitivity shading defect and the like.

Hereinafter, the problem of the conventional solid-state imaging device will be described in detail with reference to FIGS. 9 to 11 again.

As shown in FIG. 9, the centers m of the respective pixels 102a and 102b are spaced at regular intervals in a direction parallel to the main surface of the semiconductor substrate. On the other hand, in the cell C, the two pixels 102a and 102b share the drain region 113. Therefore, centers p of the light receiving regions 103a and 103b included in the pixels 102a and 102b are disposed so as to be displaced from the centers m of the pixels 102a and 102b, respectively, in a direction parallel to the main surface of the substrate. As a result, an arrangement pitch of the centers p of the respective light receiving regions 103a and 103b is not constant, while an arrangement pitch of the centers m of the respective pixels 102a and 102b is constant.

Furthermore, as described above, in order to converge the light to the pixels 102a and 102b as much as possible, each converging lens 119 is arranged so as to cover the largest possible area occupied by each of the pixels 102a and 102b with respect to the main surface of the semiconductor substrate 101. Specifically, the converging lens 119 is arranged such that its optical axis Ax passes through the center m of each of the pixels 102a and 102b. Note that in examples of FIGS. 9 to 11, the plurality of converging lenses 119 are arrayed so as to correspond to the light receiving regions 103a and 103b of pixels 102a and 102b, respectively, and formed such that the perimeters of the adjacent converging lenses 119 are tangential to each other.

A light entering each of the pixels 102a and 102b is converged by each converging lens 119, and then is incident in a direction of the optical axis Ax of the converging lens 119, i.e., in a direction toward the center m of each of the pixels 102a and 102b. However, in the case where the centers m of the pixels 102a and 102b are disposed so as to be displaced from the centers p of the light receiving regions 103a and 103b, respectively, in the direction of the main surface of the semiconductor substrate 101, the light incident to the centers m of the pixels 102a and 102b is not incident to the centers p of the light receiving regions 103a and 103b, respectively. Thus, a receiving sensitivity of each of the photoelectric conversion sections 109a and 109b is deteriorated.

It may be possible that each converging lens 119 is arranged such that its optical axis passes through the center p of each of the light receiving regions 103a and 103b, previously taking into consideration that the centers m of the pixels 102a and 102b are displaced from the centers p of the light receiving regions 103a and 103b, respectively, thereby increasing the light receiving efficiency.

However, in the case where the two pixels 102a and 102b constitute the cell C, as described above, the centers p of the respective light receiving regions 103a and 103b are not spaced at regular intervals on the semiconductor substrate 101. Therefore, when it is attempted to cause the optical axis of the converging lens 119 to coincide with the center p of each of the light receiving regions 103a and 103b, a layout of the converging lens 119 would be complex.

Hypothetically speaking, in the case where the converging lens 119 is arranged so as to correspond to the center p of each of the light receiving regions 103a and 103b, a size of the converging lens 119 needs to be smaller, and therefore an area of each of the pixels 102a and 102b cannot be effectively used. As a result, the light receiving efficiency would be contrarily reduced.

Therefore, an object of the present invention is to provide a solid-state imaging device capable of achieving both a finer pixel size and high light receiving efficiency with an excellent image characteristic such as an image sensitivity, color shading, sensitivity shading and the like.

Solution to the Problems

The present invention is directed to a solid-state imaging device. The solid-state imaging device comprises: a semiconductor substrate; and a plurality of pixels arranged on the semiconductor substrate, each of the pixels including a light receiving region for receiving an incident light. A group of a predetermined number of the pixels constitutes one pixel unit, and the light receiving region is formed such that a center thereof coincides with a center of each of the pixels in a direction parallel to a main surface of the semiconductor substrate.

Each of the pixels may include a photoelectric conversion region and a gate electrode, and the photoelectric conversion region may be formed so as to extend to a region under the gate electrode.

The solid-state imaging device according to the present invention may further comprise: a first semiconductor region formed so as to have a predetermined depth from a surface of the semiconductor substrate; an isolation region, formed on a surface of the first semiconductor region, for isolating the pixel unit from another pixel unit; and a second semiconductor region partially formed in an interior of the first semiconductor region centering on a region under the isolation region, the second semiconductor region having an impurity concentration higher than that of the first semiconductor region, wherein each of the pixels may include a photoelectric conversion region, and the photoelectric conversion region may be formed so as to extend to a region between the second semiconductor region and another second semiconductor region.

Each of the pixels may include a photoelectric conversion region, a surface region formed on a surface of the semiconductor substrate, and a gate electrode, and the surface region may be formed so as to have a predetermined clearance between the surface region and the gate electrode.

Each of the pixels may further include a converging lens, and the converging lens may be arranged such that an optical axis thereof passes through the center of each of the pixels.

The pixel unit may include a drain region, and each of the pixels may include a photoelectric conversion region, a gate electrode, and a salicide region formed on a surface of the gate electrode, and the predetermined number of the pixels included in the pixel unit may share the drain region, and the salicide region may be formed on a portion of the surface of the gate electrode, the portion being closer to a side at which the drain region is provided.

It is preferable that the pixel unit has a same pattern of the light receiving region as another pixel unit.

In this case, the pixel unit may include two of the pixels adjacent to each other, and a drain region, and the two of the pixels included in the pixel unit may have layouts symmetrical with respect to a center line of the pixel unit.

Alternatively, the pixel unit may include four of the pixels arranged in a matrix of two by two, and the drain region, and the four of the pixels included in the pixel unit may have layouts symmetrical with respect to a center of the pixel unit.

Still alternatively, the pixel unit may include four of the pixels arranged in a matrix of two by two, and the drain region, and the four of the pixels included in the pixel unit may have layouts symmetrical with respect to a center of the pixel unit and also symmetrical with respect to a center line of the pixel unit.

It is desirable that the solid-state imaging device according to the present invention is an amplifying solid-state imaging device.

EFFECT OF THE INVENTION

The solid-state imaging device according to the present invention is structured such that the center of each pixel coincides with the center of the light receiving region, thereby making it possible to obtain a high light receiving efficiency. Therefore, according to the present invention, a solid-state imaging device having an excellent image characteristic can be realized.

DESCRIPTION OF THE REFERENCE CHARACTERS 1 semiconductor substrate
2 pixel
3 light receiving region
4 low concentration p-well layer
5 high concentration p-well layer
6 STI
7 p-type STI active layer
8 photoelectric conversion layer (p-type)
9 photoelectric conversion layer (n-type)
10 gate electrode
11 spacer
12 salicide region
13 drain region
14 Vt control layer
15 barrier control layer
16 insulation film
17 light shielding film
18 color filter
19 converging lens
20 incident light C cell
m center of pixel
p center of light receiving region
Ax optical axis
L incident light

BEST MODE FOR CARRYING OUT THE INVENTION

First Embodiment

Hereinafter, with reference to the drawings, a solid-state imaging device according to a first embodiment of the present invention will be described, taking a solid-state imaging device including cells each composed of two pixels as an example. For facilitating the understanding of the following description, positional relationships are indicated by short-dash lines, dot-dash lines and double-dot-dash lines in the respective figures.

Figure 1:
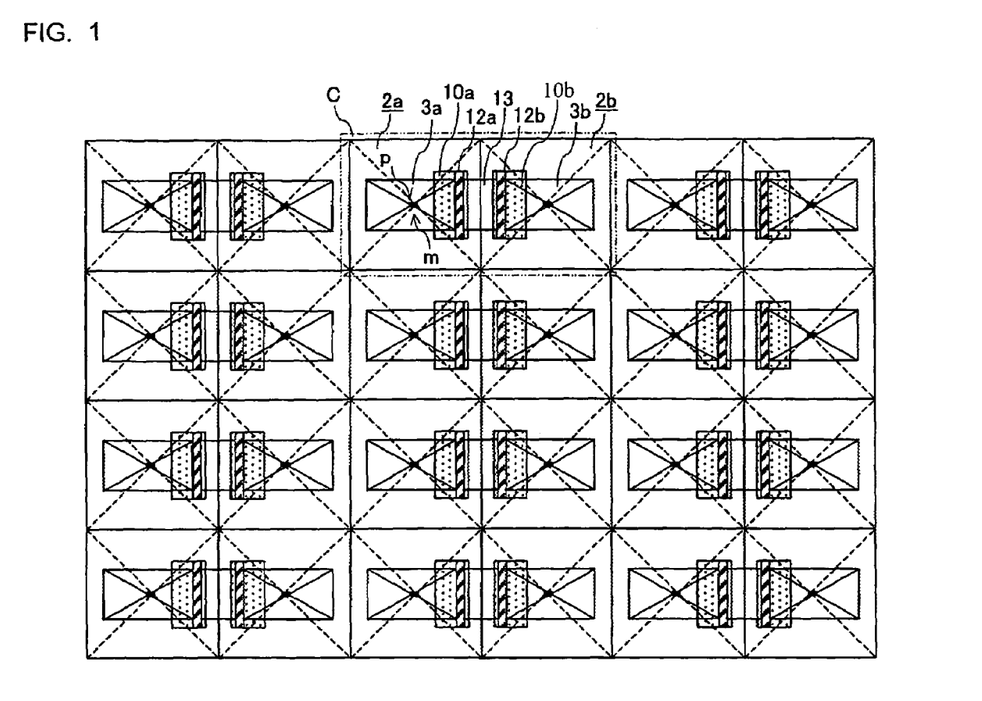
FIG. 1 is a plan view schematically illustrating a solid-state imaging device according to a first embodiment of the present invention.

FIG. 1 is a plan view schematically illustrating the solid-state imaging device according to the first embodiment of the present invention. For the sake of simplicity, FIG. 1 shows a state where a portion of components included in the pixels are projected onto a main surface of a semiconductor substrate (not shown).

The solid-state imaging device shown in FIG. 1 includes a plurality of pixels $2a$ and $2b$ arranged in a two-dimensional matrix on the semiconductor substrate (not shown). Each of the pixels $2a$ and $2b$ includes a photoelectric conversion layer (not shown) for converting an incident light into a signal electric charge. Points m at which centers of the plurality of respective pixels $2a$ and $2b$ are projected onto the semiconductor substrate (not shown) (hereinafter, each of the points m is referred to as "a center of a pixel") are spaced at regular intervals in a direction parallel to the main surface of the semiconductor substrate.

The pixels $2a$ and $2b$ include light receiving regions $3a$ and $3b$ for receiving an incident light, gate electrodes $10a$ and $10b$, and salicide regions $12a$ and $12b$, respectively.

Furthermore, the pixels $2a$ and $2b$ adjacent to each other constitute one cell C (in units of pixels). The cells, each including an arrangement pattern of a predetermined number of the light receiving regions $3a$ and $3b$ as one group, have the same structure as one another. In the present embodiment, the pixels $2a$ and $2b$ included in the cell C have layouts symmetrical with respect to a center line (a boundary line between the pixels $2a$ and $2b$ shown in FIG. 1). Hereinafter, only the cell C will be described in detail.

Next, with reference to FIGS. 2 and 3, a positional relationship between the pixel 2 and the light receiving region 3 will be described in more detail.

Figure 2:
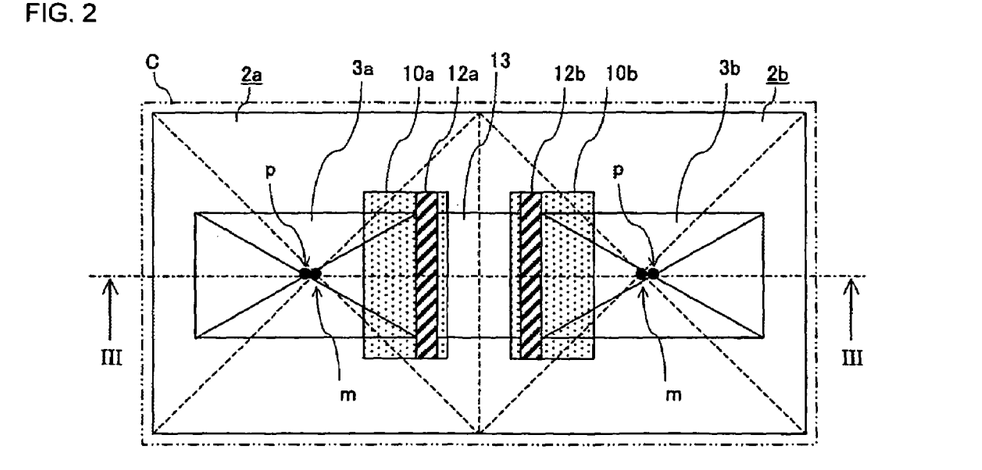
FIG. 2 is an enlarged view of a cell C shown in FIG. 1.
Figure 3:
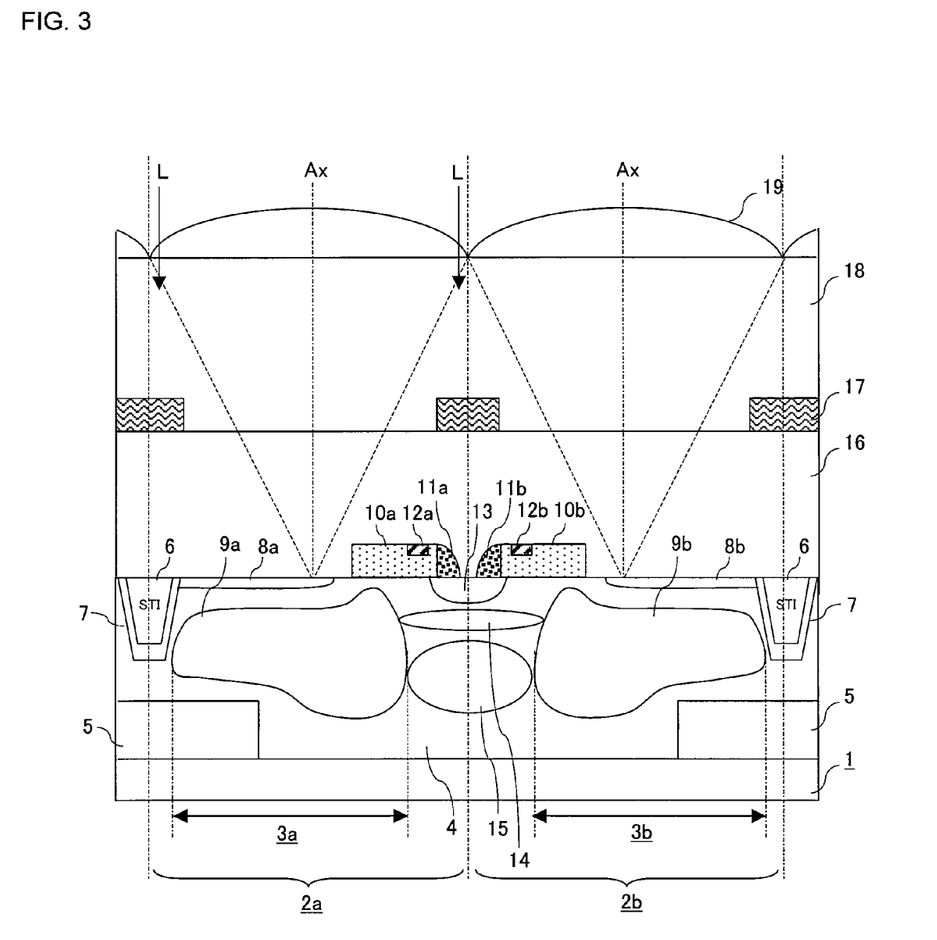
FIG. 3 is a cross-sectional view of the cell C along lines III-III shown in FIG. 2.

FIG. 2 is an enlarged view of the cell C shown in FIG. 1, and FIG. 3 is a cross-sectional view thereof along lines III-III shown in FIG. 2.

As shown in FIGS. 2 and 3, the solid-state imaging device according to the present embodiment includes a semiconductor substrate 1, a low concentration p-well layer 4, high concentration p-well layers 5 each having an impurity concentration higher than that of the low concentration p-well layer 4, a STI 6, a p-type STI active layer 7, p-type photoelectric conversion layers $8a$ and $8b$, n-type photoelectric conversion layers $9a$ and $9b$, gate electrodes $10a$ an $10b$, spacers $11a$ and $11b$, salicide regions $12a$ and $12b$, a drain region 13, a Vt control layer 14, a barrier control layer 15, an insulation film 16, a light shielding film 17, a color filter 18, and converging lenses 19.

The pixel 2a mainly includes the photoelectric conversion layers 8a and 9a forming a photodiode and the gate electrode 10a. Similarly, the pixel 2b mainly includes the photoelectric conversion layers 8b and 9b and the gate electrode 10b. Particularly, in the present embodiment, the photoelectric conversion layer 8a is formed so as to have a clearance between the photoelectric conversion layer 8a and the gate electrode 10a. Similarly, the photoelectric conversion layer 8b is formed so as to have a clearance between the photoelectric conversion layer 8b and the gate electrode 10b. Note that the cell C composed of the pixels 2a and 2b is isolated from another cell adjacent thereto by means of the STI 6.

As shown in FIG. 3, in the present embodiment, the high concentration p-well layer 5 is formed centering on a region under the STI 6, and is not formed under the gate electrodes 10a and 10b. Instead, the photoelectric conversion layers 9a and 9b are formed so as to extend to regions under the gate electrodes 10a and 10b, respectively. Furthermore, the salicide regions 12a and 12b are formed on only portions of surfaces of the gate electrodes 10a and 10b, respectively. More specifically, the salicide regions 12a and 12b are formed such that lengths (extending in the left-right direction shown in FIG. 3) of the salicide regions 12a and 12b are shorter than gate lengths of the gate electrodes 10a and 10b, respectively. Furthermore, the salicide regions 12a and 12b are respectively formed on portions of the surfaces of the gate electrodes 10a and 10b, the portions being closer to a side at which the drain region 13 is provided.

On the gate electrodes 10a and 10b, the insulation film 16 is formed. On the insulation film 16, the light shielding film 17 having an opening in a predetermined region above each of the photoelectric conversion layers 9a and 9b is formed. Further, on the light shielding film 17, the color filter 18 is formed, and on the color filter 18, the plurality of converging lenses 19 are arranged.

In order to converge a light to the corresponding pixel 2 as much as possible, each converging lens 19 is arranged so as to cover the largest possible area occupied by each of the pixels 2a and 2b with respect to the main surface of the semiconductor substrate. Specifically, the converging lens 19 is arranged such that its optical axis passes through the center m of each of the pixels 2a and 2b. In the present embodiment, as shown in FIG. 3, the plurality of converging lenses 19, arrayed so as to correspond to the plurality of pixels 2a and 2b, respectively, are formed such that the perimeters of the adjacent converging lenses 19 are tangential to each other.

Note that as shown in FIG. 3, each of the light receiving regions 3a and 3b according to the present embodiment is defined by the opening of the light shielding film 17, a region occupied by each of the photoelectric conversion layers 9a and 9b (i.e., a region in which each of the photoelectric conversion layers 9a and 9b is projected onto the main surface of the semiconductor substrate 1), and a region, on the main surface of the semiconductor substrate 1, through which the incident light can pass. The region, on the main surface of the semiconductor substrate 1, through which the incident light can pass varies depending on a position and a size of each of the salicide regions 12a and 12b.

Generally, in a solid-state imaging device including cells each composed of two pixels, the two pixels adjacent to each other share the drain region 13. Therefore, the centers m of the pixels 2a and 2b adjacent to each other are disposed so as to be displaced from centers p of the light receiving regions 3a and 3b, respectively, in the direction of the main surface of the substrate. Thus, in the solid-state imaging device according to the conventional art, a pitch of the centers p included in the light receiving regions 1-3a and 103b is not constant, while a pitch of the centers m of the respective pixels 102a and 102b is constant on the semiconductor substrate 101.

In contrast, in the solid-state imaging device according to the present embodiment, as shown in FIG. 1, the centers m of the pixels 2a and 2b substantially coincide with the centers p of the light receiving regions 3a and 3b, respectively.

Specifically, as shown in FIG. 3, the high concentration p-well layer 5 is not formed under each of the gate electrodes 10a and 10b, but is partially formed in the interior of the semiconductor substrate 1 centering on the region under the STI 6. Accordingly, the photoelectric conversion layers 9a and 9b are formed so as to extend to the regions under the gate electrodes 10a and 10b, respectively. Furthermore, the salicide regions 12a and 12b are formed at respective positions closer to the side at which the drain region 13 is provided, so as to cover only the portions of the surfaces of the gate electrodes 10a and 10b, respectively. Such a structure allows the incident light to pass through a portion, included in the surfaces of the gate electrodes 10a and 10b, on which the salicide regions 12a and 12a are not formed, and then to be incident on the photoelectric conversion layers 9a and 9b extending to the regions under the gate electrodes 10a and 10b, respectively.

Furthermore, in the solid-state imaging device according to the present embodiment, each converging lens 19 is arranged such that its optical axis passes through the center m of each of the pixels 2a and 2b. Therefore, a light L entering each of the pixels 2a and 2b is converged by the converging lens 19 so as to be incident to the center m of each of the pixels 2a and 2b. As described above, the solid-state imaging device according to the present embodiment is structured such that the centers m of the pixels 2a and 2b substantially coincide with the centers p of the light receiving regions 3a and 3b, respectively, in the direction of the main surface of the semiconductor substrate 1, thereby allowing the light converged by the converging lens 19 to be incident to the center p of each of the light receiving regions 3a and 3b.

As such, the solid-state imaging device according to the present embodiment is structured such that the centers m of the pixels 2a and 2b overlap with the centers p of the light receiving regions 3a and 3b, respectively. Therefore, according to the present embodiment, without changing the placement of the converging lens 19, the light to be incident to the centers m of the pixels 2a and 2b is allowed to be further incident to the centers p of the light receiving regions 3a and 3b, respectively, thereby making it possible to obtain a high light receiving efficiency. As a result, a sensitivity deterioration, variation of image sensitivity, color shading defect, sensitivity shading defect and the like can be suppressed, thereby realizing a solid-state imaging device having an excellent image characteristic.

A method of fabricating the solid-state imaging device according to the present embodiment will be described.

FIGS. 4A to 4K are cross-sectional views schematically describing the method of fabricating the solid-state imaging device according to the first embodiment of the present invention.

Figure 4A:
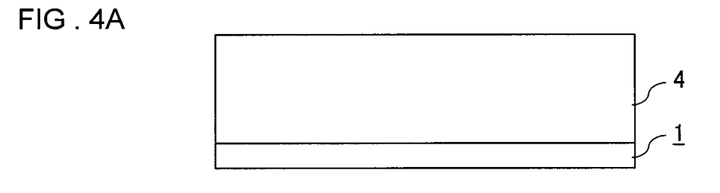
FIG. 4A is a cross-sectional view schematically describing a method of fabricating the solid-state imaging device according to the first embodiment of the present invention.

Firstly, as shown in FIG. 4A, the low concentration p-well layer 4 (the impurity concentration: $1 \times 10^{14}$ to $1 \times 10^{15}$ $cm^{-3}$) is formed in the interior of the semiconductor substrate 1 of n-type so as to have a depth of approximately 3 μm from the surface of the semiconductor substrate 1.

Figure 4B:
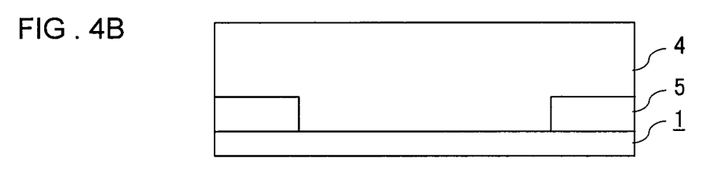
FIG. 4B is a cross-sectional view describing steps subsequent to those of FIG. 4A.

Next, as shown in FIG. 4B, the high concentration p-well layer 5 (the impurity concentration: $1 \times 10^{15}$ to $1 \times 10^{16}$ $cm^{-3}$) having the impurity concentration higher than that of the low concentration p-well layer 4 is formed at a position where an pixel isolation region is to be formed on the semiconductor substrate 1 such that a concentration peak position of the high concentration p-well layer 5 is at a depth of 0.9 μm from the surface of the semiconductor substrate 1.

Figure 4C:
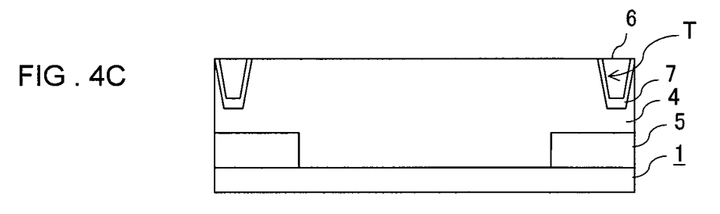
FIG. 4C is a cross-sectional view describing steps subsequent to those of FIG. 4B.

Then, as shown in FIG. 4C, the STI 6 is formed so as to have a predetermined depth from the surface of the semiconductor substrate 1. More specifically, a trench T is firstly formed at a position where a device isolation section is to be formed by a dry etching process. A depth of the trench T is approximately 0.3 μm. Thereafter, ions are implanted into an internal surface of the trench T at low energy. Specifically, boron (B) ions are implanted into the internal surface of the trench T so as to satisfy conditions of 30 KeV and $3.2 \times 10^{13}/cm^2$. Thus, a $p^+$-type inner film 7 is formed along the internal surface of the trench T. Then, an insulation film such as an oxide film is buried in the trench T in which the inner film 7 is formed, and a surface of the insulation film is planarized. The STI 6 is formed through the aforementioned steps.

Figure 4D:
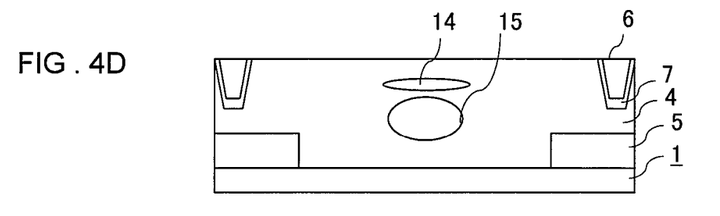
FIG. 4D is across-sectional view describing steps subsequent to those of FIG. 4C.

Next, as shown in FIG. 4D, the Vt control layer 14 of p-type and the barrier control layer 15 are formed in the interior of the low concentration p-well layer 4. A concentration peak position of the Vt control layer is at a depth of 0.3 μm from the surface of the semiconductor substrate 11, and a concentration peak position of the barrier control layer 15 is at a depth of 0.8 μm from the surface of the semiconductor substrate.

Figure 4E:
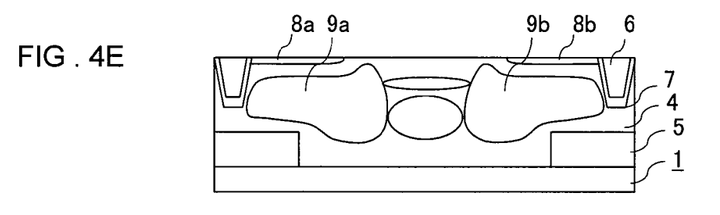
FIG. 4E is a cross-sectional view describing steps subsequent to those of FIG. 4D.

Then, as shown in FIG. 4E, the p-type photoelectric conversion layers 8a and 8b and the n-type photoelectric conversion layers 9a and 9b are formed. More specifically, in accordance with a well-known method, provided is a resist pattern having an opening in a region (a region determined by design), on the main surface of the semiconductor substrate 1, where each of the photoelectric conversion layers 9a and 9b is to be formed. Thereafter, using the resist pattern as a mask, ions of arsenic (As) as an n-type impurity are implanted at high energy. Specifically, As ions are implanted so as to satisfy conditions of 600 KeV, $2.2 \times 10^{12}/cm^2$. Thus, the photoelectric conversion layers 9a and 9b are formed in the interior of the semiconductor substrate 1. A concentration peak position of each of the photoelectric conversion layers 9a and 9b is at a depth of approximately 0.3 μm from the surface of the semiconductor substrate 1.

Next, in accordance with the well-known method, a p-type impurity is selectively introduced into the surface of the semiconductor substrate 1, thereby forming the photoelectric conversion layers 8a and 8b. In the present embodiment, the p-type impurity is introduced into a region discrete from another region, on the surface of the semiconductor substrate 1, where each of the gate electrodes 10a and 10b is to be formed (said another region determined by design) by a predetermined distance. Thus, it is possible to maintain a state where the n-type photoelectric conversion layers 9a and 9b extend to the regions under the gate electrodes 10a and 10b, respectively, to be provided on the main surface of the semiconductor substrate 1.

Figure 4F:
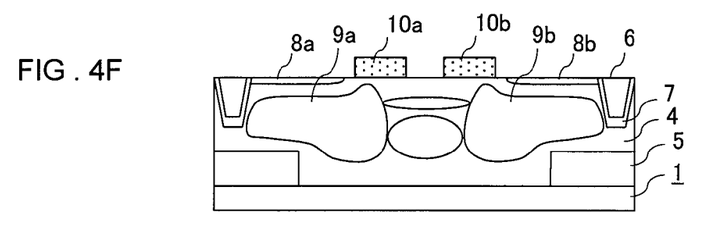
FIG. 4F is a cross-sectional view describing steps subsequent to those of FIG. 4E.

Then, as shown in FIG. 4F, the gate electrodes 10a and 10b are formed. More specifically, a polycrystalline silicon film is deposited by a CVD method on the surface of the semiconductor substrate 1 so as to have a thickness of 200 nm. Thereafter, the deposited polycrystalline silicon film is patterned by a photolithography process, dry etching process and the like, thereby forming the gate electrodes 10a and 10b.

Figure 4G:
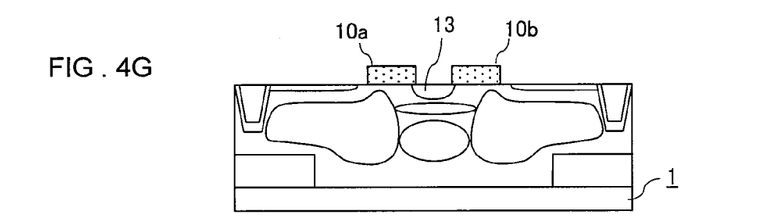
FIG. 4G is a cross-sectional view describing steps subsequent to those of FIG. 4F.

Next, as shown in FIG. 4G, the drain region 13 is formed on the main surface of the semiconductor substrate 1. More specifically, using the formed gate electrodes 10a and 10b as a mask, ions of the n-type impurity are implanted into a portion included in the main surface of the semiconductor substrate, the portion also being exposed between the gate electrodes 10a and 10b. Specifically, arsenic (As) ions are implanted so as to satisfy conditions of 50 KeV and $2.0 \times 10^{15}/cm^2$, thereby forming the drain region 13 on the main surface of the semiconductor substrate 1.

Figure 4H:
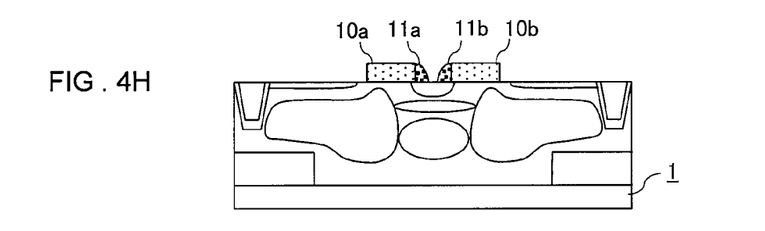
FIG. 4H is a cross-sectional view describing steps subsequent to those of FIG. 4G.

Then, as shown in FIG. 4H, an oxide film is deposited by the CVD method on the surface of the semiconductor substrate 1 so as to have a thickness of 150 nm. Thereafter, the deposited oxide film is patterned by the photolithography process, dry etching and the like, thereby forming the spacers 11 along side walls, of the respective gate electrodes 10a and 10b, which are opposed to each other.

Figure 4I:
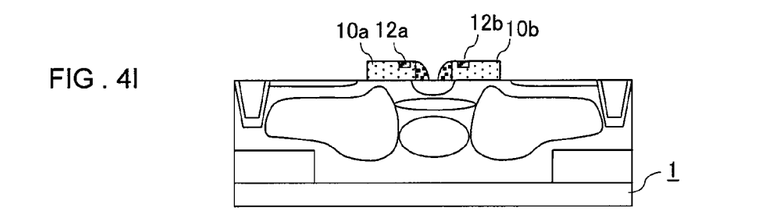
FIG. 4I is a cross-sectional view describing steps subsequent to those of FIG. 4H.

Next, as shown in FIG. 4I, a portion of the surface of each of the gate electrodes 10a and 10b is salicided. More specifically, a compound of $CoSi_2$ or the like is deposited by a sputtering method on the portion of the surface of each of the gate electrodes 10a and 10b. The incident light can pass through a non-salicide region (a portion in which the salicide region 12 is not formed) of the surface of each of the gate electrodes 10a and 10b. Thus, it becomes possible to allow the light to be incident to the photoelectric conversion layers 9a and 9b formed so as to extend to the regions under the gate electrodes 10a and 10b, respectively.

Figure 4J:
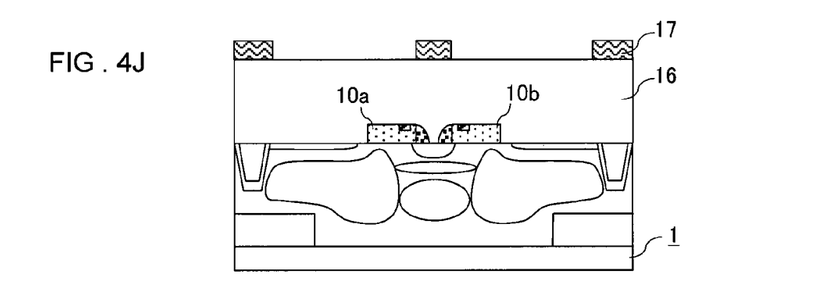
FIG. 4J is a cross-sectional view describing steps subsequent to those of FIG. 4I.

Then, as shown in FIG. 4J, the insulation film 16 made of a silicon oxide film is deposited by the CVD method so as to cover the gate electrodes 10a and 10b. Note that the insulation film 16 includes a wiring layer. For the sake of brevity, however, the description of the wiring layer will be omitted herein. Thereafter, the light shielding film 17 is formed so as to cover the insulation film 16. More specifically, a thin film is formed so as to cover the insulation film 16 by using tungsten, copper, aluminum and the like and by using a PVD or CVD method. Then, a portion, of the formed thin film, where is positioned above each of the photoelectric conversion layers 9a and 9b is selectively removed by dry etching. Thus, as shown in FIG. 4J, in the light shielding film 17, an opening is formed at a position corresponding to each of the photoelectric conversion layers 9a and 9b, thereby forming the light receiving regions 3a and 3b.

Figure 4K:
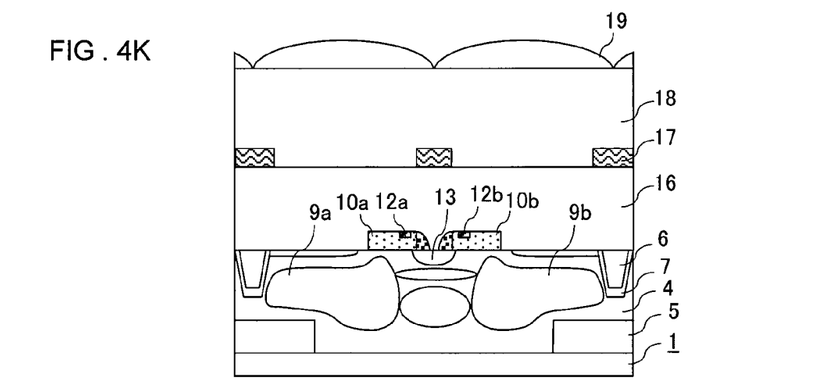
FIG. 4K is a cross-sectional view describing steps subsequent to those of FIG. 4J.

Next, as shown in FIG. 4K, the color filter 18 and the converging lenses 19 are formed on the light shielding film 17. The converging lens 19 is a microlens made by transferring a heat-soluble transparent resin or a resist by a thermal reflow process, and arrayed so as to correspond to each light receiving region 3 of the pixel 2. Thus, a solid-state imaging device having a structure as shown in FIG. 4K is fabricated.

As described above, according to the fabrication method of the present embodiment, the solid-state imaging device can be fabricated such that the centers of the light receiving regions 3a and 3b overlap with the centers m of the pixels 2a and 2b, respectively. Furthermore, according to the fabrication method of the present embodiment, a high light receiving efficiency can be obtained without changing the placement of the converging lens 19. Therefore, it becomes possible to fabricate a solid-state imaging device having an excellent image characteristic.

The above present embodiment illustrates an example of the solid-state imaging device including the cells each composed of two pixels. However, the present invention is also applicable to a solid-state imaging device having a light receiving region and including the cells each composed of a plurality of pixels, such as a solid-state imaging device comprising the cells each composed of three or four pixels.

Second Embodiment

Figure 5:
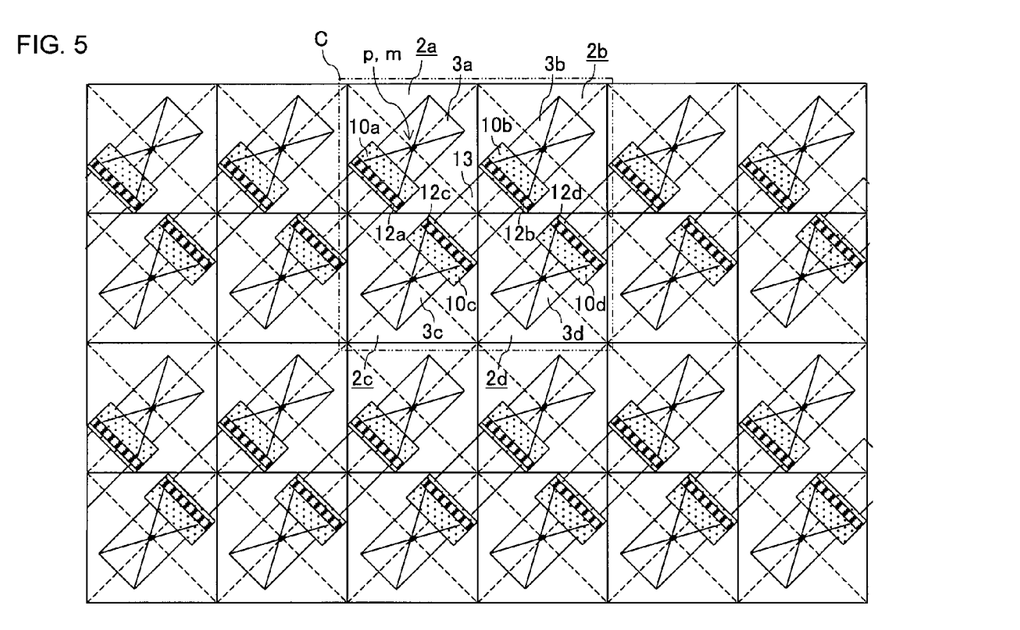
FIG. 5 is a plan view schematically illustrating the solid-state imaging device according to a second embodiment of the present invention.

FIG. 5 is a plan view schematically illustrating the solid-state imaging device according to a second embodiment of the present invention.

In the solid-state imaging device according to the present embodiment, four pixels 2a to 2d constitute one cell C. The pixels 2a to 2d included in the cell C have layouts symmetrical with respect to a center of the cell C.

More specifically, as shown in FIG. 5, in the pixels 2a to 2d each having a substantially rectangular shape, each of the light receiving regions 3a to 3d is formed so as to extend in a direction along a diagonal line of each pixel. Furthermore, the light receiving regions 3b and 3c of a pair of the pixels 2b and 2c arranged along the diagonal line of the cell C are also arranged along the diagonal line of the cell. The light receiving regions 3b and 3c of the pixels 2b and 2c also share the drain region 13 formed at the center of the cell.

Figure 6:
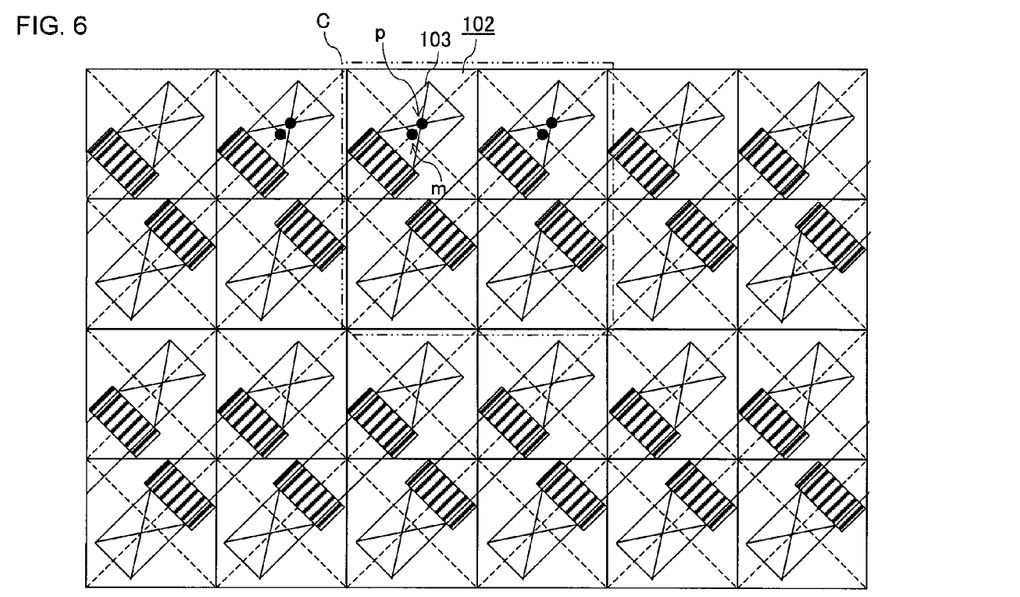
FIG. 6 is a plan view illustrating an example of a conventional solid-state imaging device including cells each composed of four pixels.

FIG. 6 is a plan view illustrating an example of a conventional solid-state imaging device comprising cells each composed of four pixels.

Similarly to the first embodiment, in the conventional solid-state imaging device including the cells each composed of four pixels, the light receiving region 103 is formed such that its center p is displaced from the center m of the pixel 102. On the other hand, for improving the converging efficiency, a converging lens (not shown) is arranged such that its optical axis usually passes through the center m of the pixel 102. Therefore, also in the conventional solid-state imaging device shown in FIG. 9, a light converged by the converging lens (not shown) is to be incident to a position displaced from the center p of the light receiving region 103, thereby deteriorating the converging efficiency.

In contrast, similarly to the first embodiment, in the solid-state imaging device according to the present embodiment, the photoelectric conversion layer (not shown) is formed so as to extend to the region under each of the gate electrodes 10a to 10d, and the salicide regions 12a to 12d are respectively formed on only portions of regions, of the surfaces of the gate electrodes 10a to 10d, which are closer to the side at which the drain region 13 is provided. Therefore, according to the present embodiment, a solid-state imaging device having a layout in which each cell is composed of four pixels can be structured such that the centers m of the pixels 2a to 2d overlap with the centers p of the light receiving regions 3a to 3d, respectively. Thus, it becomes possible to realize a solid-state imaging device having an excellent image characteristic.

Third Embodiment

Figure 7:
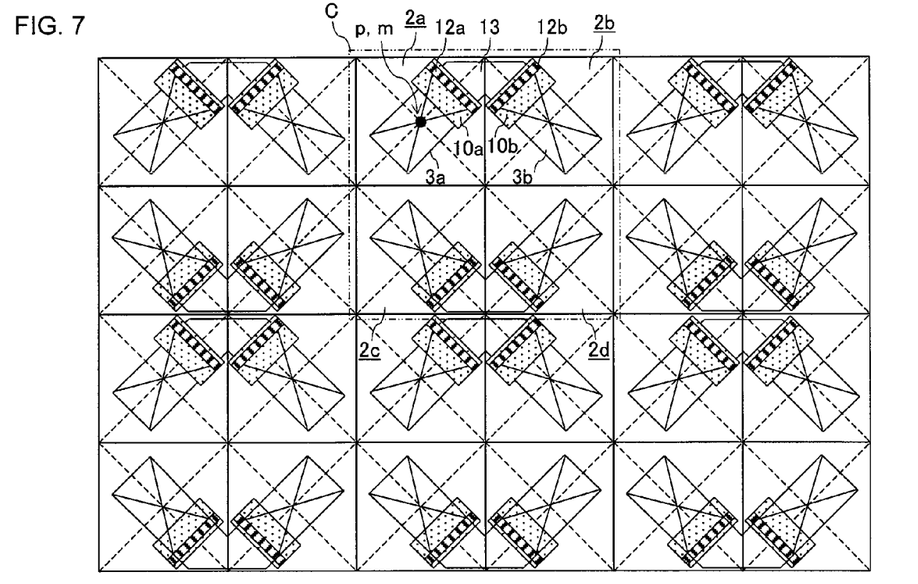
FIG. 7 is a plan view schematically illustrating the solid-state imaging device according to a third embodiment of the present invention.

FIG. 7 is a plan view schematically illustrating the solid-state imaging device according to a third embodiment of the present invention.

Similarly to the second embodiment, in the solid-state imaging device according to the present embodiment, the four pixels 2a to 2d, each having a substantially rectangular shape, constitute one cell C. Furthermore, each of the light receiving regions 3a to 3d of the pixels 2a to 2d is formed so as to extend along a diagonal line of each pixel. However, the solid-state imaging device of the present embodiment is different from that of the second embodiment in that the pixels 2a to 2d included in the cell C have layouts symmetrical with the center of the cell C and also symmetrical with a center line of the cell C, in the present embodiment. Specifically, two pixels 2a and 2b adjacent to each other in a row direction share the drain region 13.

Figure 8:
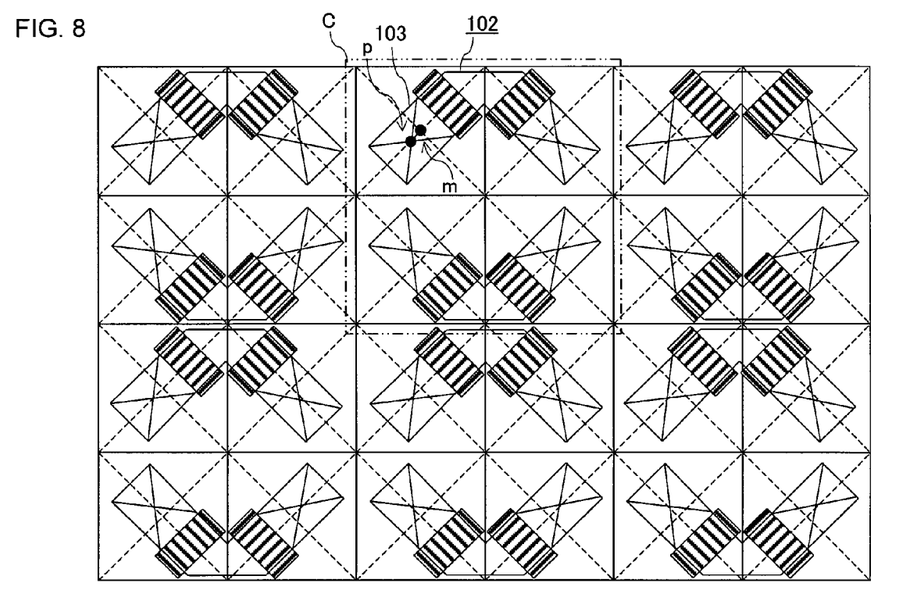
FIG. 8 is a plan view schematically illustrating another example of the conventional solid-state imaging device including the cells each composed of four pixels.

FIG. 8 is a plan view illustrating another example of the conventional solid-state imaging device comprising the cells each composed of four cells.

Similarly to the second embodiment, in the conventional solid-state imaging device including the cells each composed of four pixels, the light receiving region 3 is formed such that the center p thereof is displaced from the center m of the pixel 2. Therefore, the light converged by the converging lens (not shown) is to be incident to a position displaced from the center p of the light receiving region 3, thereby resulting in the deterioration of the converging efficiency.

In contrast, similarly to the first embodiment, in the solid-state imaging device according to the present embodiment, the photoelectric conversion layer (not shown) is formed so as to extend to the region under each of the gate electrodes 10a to 10d, and the salicide regions 12a to 12d are respectively formed on only portions of the regions, of the surfaces of the gate electrodes 10a to 10d, which are closer to the side at which the drain region 13 is provided. Thus, it becomes possible to realize a solid-state imaging device having an improved converging efficiency and an excellent image characteristic.

The above embodiments illustrate the case where one cell is composed of two or four pixels. However, the number of pixels constituting one cell is not particularly limited.

Furthermore, the above embodiments illustrate the case where a structure of the cell is specified. However, if the cell has an arrangement pattern of a predetermined number of the light receiving regions as one group, other structures are also possible.

Still furthermore, in the above embodiments, a MOS type solid-state imaging device is described. However, the present invention may also be applicable to a CCD type solid-state imaging device.

INDUSTRIAL APPLICABILITY

The present invention is applicable to an amplifying solid-state imaging device, more particularly to a MOS type solid-state imaging device or the like having a trench isolation structure. More specifically, the present invention is used as a solid-state imaging device included in a cellular phone with a camera, a video camera, a digital still camera and the like, or a line sensor included in a printer and the like.

The invention claimed is:

1. A solid-state imaging device comprising:
   a semiconductor substrate; and
   a plurality of pixels arranged on the semiconductor substrate, each of the pixels including a light receiving region for receiving an incident light, wherein
   a group of a predetermined number of the pixels constitutes one pixel unit,
   each of the pixels includes a photoelectric conversion region, a light shielding film, and a gate electrode,
   the photoelectric conversion region is formed to as to extend to a region under the gate electrode,
   the gate electrode partially includes a region through which the incident light cannot pass,
   the light receiving region is defined by an opening of the light shielding film, a region in which the photoelectric conversion region is projected onto the main surface of the semiconductor substrate, and a region, including in the main surface of the semiconductor substrate, through which the incident light can pass,
   the light receiving region is formed such that a center thereof coincides with a center of each of the pixels in a direction parallel to the main surface of the semiconductor substrate, and
   a deepest point of the photoelectric conversion region is at the gate electrode side relative to the center of the light receiving region.

2. The solid-state imaging device according to claim 1, wherein
the region, included in the main surface of the semiconductor substrate, through which the incident light can pass varies depending on a position and a size of the region, included in the gate electrode, through which the incident light cannot pass.

3. The solid-state imaging device according to claim 1, further comprising:
a first semiconductor region formed so as to have a predetermined depth from a surface of the semiconductor substrate;
an isolation region, formed on a surface of the first semiconductor region, for isolating the pixel unit from another pixel unit; and
a second semiconductor region partially formed in an interior of the first semiconductor region centering on a region under the isolation region, the second semiconductor region having an impurity concentration higher than that of the first semiconductor region, wherein
the photoelectric conversion region is formed so as to extend to a region between the second semiconductor region and another second semiconductor region.

4. The solid-state imaging device according to claim 1, wherein
each of the pixels includes a surface region formed on a surface of the semiconductor substrate, and
the surface region is formed so as to have a predetermined clearance between the surface region and the gate electrode.

5. The solid-state imaging device according to claim 1, wherein
each of the pixels further includes a condensing lens, and
the condensing lens is arranged such that an optical axis thereof passes through the center of each of the pixels.

6. The solid-state imaging device according to claim 1, wherein
the pixel unit includes a drain region,
each of the pixels further includes a salicide region formed on a surface of the gate electrode,
the predetermined number of the pixels included in the pixel unit share the drain region, and
the salicide region is formed on a portion of the surface of the gate electrode, the portion being closer to a side at which the drain region is provided.

7. The solid-state imaging device according to claim 1, wherein
the pixel unit has a same pattern of the light receiving region as another pixel unit.

8. The solid-state imaging device according to claim 7, wherein
the pixel unit includes two of the pixels adjacent to each other, and a drain region, and
the two of the pixels included in the pixel unit have layouts symmetrical with respect to a center line of the pixel unit.

9. The solid-state imaging device according to claim 7, wherein
the pixel unit includes four of the pixels arranged in a matrix of two by two, and the drain region, and
the four of the pixels included in the pixel unit have layouts symmetrical with respect to a center of the pixel unit.

10. The solid-state imaging device according to claim 7, wherein
the pixel unit includes four of the pixels arranged in a matrix of two by two, and the drain region, and
the four of the pixels included in the pixel unit have layouts symmetrical with respect to a center of the pixel unit and symmetrical with respect to a center line of the pixel unit.

11. The solid-state imaging device according to claim 1, wherein
the solid-state imaging device is an amplifying solid-state imaging device.

* * * * *